United States Patent
Chen et al.

(10) Patent No.: US 9,704,888 B2
(45) Date of Patent: Jul. 11, 2017

(54) DISPLAY CIRCUITRY WITH REDUCED METAL ROUTING RESISTANCE

(71) Applicant: Apple Inc., Cupertino, CA (US)

(72) Inventors: Yu Cheng Chen, San Jose, CA (US); Shih-Chang Chang, Cupertino, CA (US); Hiroshi Osawa, Sunnyvale, CA (US); Ting-Kuo Chang, Cupertino, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 14/150,458

(22) Filed: Jan. 8, 2014

(65) Prior Publication Data

US 2015/0194443 A1    Jul. 9, 2015

(51) Int. Cl.
*H01L 27/12* (2006.01)
*H01L 29/786* (2006.01)

(52) U.S. Cl.
CPC ........ *H01L 27/124* (2013.01); *H01L 27/1248* (2013.01); *H01L 29/78645* (2013.01); *H01L 29/78633* (2013.01)

(58) Field of Classification Search
CPC ............. G02F 1/136286; G02F 1/1393; G02F 2001/136222; G02F 1/136209;
(Continued)

(56) References Cited

U.S. PATENT DOCUMENTS 6,498,369 B1 * 12/2002 Yamazaki ........... G02F 1/13454
257/347
7,211,898 B2   5/2007 Lee et al.
(Continued)

FOREIGN PATENT DOCUMENTS

CN    1286493    3/2001
CN    1373384    10/2002
(Continued)

OTHER PUBLICATIONS

First Office Action regarding Chinese Application No. 201410105759.6, dated Dec. 28, 2015. Translation provided by Dragon Intellectual Property Law Firm.

*Primary Examiner* — Jessica Manno
*Assistant Examiner* — Mohammed R Alam
(74) *Attorney, Agent, or Firm* — Treyz Law Group, P.C.; Jason Tsai; Zachary D. Hadd

(57) ABSTRACT

A display may have a color filter layer and a thin-film transistor layer. A layer of liquid crystal material may be located between the color filter layer and the thin-film transistor (TFT) layer. The TFT layer may include thin-film transistors formed on top of a glass substrate. A passivation layer may be formed on the thin-film transistor layers. An oxide liner may be formed on the passivation layer. A first low-k dielectric layer may be formed on the oxide liner. A second low-k dielectric layer may be formed on the first low-k dielectric layer. A common voltage electrode and associated storage capacitance may be formed on the second low-k dielectric layer. Thin-film transistor gate structures may be formed in the passivation layer. Conductive routing structures may be formed on the oxide liner, on the first low-k dielectric layer, and on the second low-k dielectric layer. The use of routing structures on the oxide liner reduces overall routing resistance and enables interlaced metal routing, which can help reduce the inactive border area outside the active display regions.

21 Claims, 13 Drawing Sheets

(58) Field of Classification Search
CPC ............... G02F 2201/40; G02F 1/1345; G02F 1/13452; H01L 27/1288; H01L 27/3265; H01L 27/3244; H01L 2227/323; H01L 27/3262

See application file for complete search history.

(56) References Cited

U.S. PATENT DOCUMENTS

| | | |
|---|---|---|
| 8,012,794 B2 | 9/2011 | Ye |
| 8,101,949 B2 | 1/2012 | Ye |
| 8,143,093 B2 | 3/2012 | Ye |
| 8,258,511 B2 | 9/2012 | Ye |
| 8,344,374 B2 | 1/2013 | Yamazaki et al. |
| 8,349,669 B2 | 1/2013 | Ye |
| 8,421,083 B2 | 4/2013 | Yamazaki et al. |
| 8,435,843 B2 | 5/2013 | Ye |
| 8,617,946 B2 | 12/2013 | Liu et al. |
| 8,617,986 B2 | 12/2013 | Liang et al. |
| 2002/0134983 A1* | 9/2002 | Yamazaki ............ H01L 27/1214 257/72 |
| 2002/0195604 A1* | 12/2002 | Segawa ............. G02F 1/136227 257/72 |
| 2003/0128326 A1* | 7/2003 | Yamaguchi ......... G02F 1/13452 349/152 |
| 2003/0222311 A1* | 12/2003 | Kim .................... G02F 1/13454 257/347 |
| 2005/0036080 A1 | 2/2005 | Koide |
| 2005/0051776 A1* | 3/2005 | Miyagi ................ G09G 3/3233 257/72 |
| 2006/0082536 A1* | 4/2006 | Koyama ............. G09G 3/3659 345/100 |
| 2007/0030409 A1* | 2/2007 | Aoki ..................... G02F 1/1345 349/56 |
| 2007/0222936 A1* | 9/2007 | Shih .................. G02F 1/136286 349/187 |
| 2008/0225223 A1 | 9/2008 | Yanagawa et al. |
| 2009/0005699 A1 | 1/2009 | Sakurai et al. |
| 2009/0244678 A1* | 10/2009 | Hagood, IV ........... G02B 26/02 359/230 |
| 2010/0039600 A1* | 2/2010 | Ishige .................. G02F 1/1345 349/139 |
| 2010/0213531 A1* | 8/2010 | Asami .................... H01L 21/84 257/316 |
| 2011/0018001 A1 | 1/2011 | Tsai et al. |
| 2011/0253998 A1 | 10/2011 | Theiss et al. |
| 2011/0263085 A1* | 10/2011 | Yamazaki ............. H01L 21/383 438/161 |
| 2011/0317500 A1* | 12/2011 | Uochi .................... G11C 11/404 365/189.011 |
| 2012/0120616 A1 | 5/2012 | Katsui et al. |
| 2014/0176886 A1* | 6/2014 | Yoshida ................ G02F 1/1339 349/110 |
| 2014/0231799 A1* | 8/2014 | Matsubayashi ..... H01L 27/0629 257/43 |
| 2014/0239270 A1* | 8/2014 | Ko ....................... H01L 27/1255 257/40 |
| 2014/0353605 A1* | 12/2014 | Kim ....................... H01L 27/124 257/40 |
| 2015/0123114 A1* | 5/2015 | Lim ....................... H01L 27/124 257/43 |

FOREIGN PATENT DOCUMENTS

| | | |
|---|---|---|
| CN | 1381749 | 11/2002 |
| CN | 1485666 | 3/2004 |
| CN | 1577893 | 2/2005 |
| CN | 1652348 | 8/2005 |
| CN | 1758304 | 4/2006 |
| CN | 101625471 | 1/2010 |
| CN | 102870219 | 1/2013 |
| CN | 204391112 | 6/2015 |
| JP | H06082826 | 3/1994 |
| JP | 11-097698 | 4/1999 |
| JP | 2001077373 | 3/2001 |
| JP | 2002094065 | 3/2002 |
| JP | 2004253596 | 9/2004 |
| JP | 2005031645 | 2/2005 |
| JP | 2005173579 | 6/2005 |
| JP | 2008034367 | 2/2008 |
| JP | 2011164329 | 8/2011 |
| JP | 2011186362 | 9/2011 |
| JP | 2014-186788 | * 10/2014 |
| KR | 2002-0046217 | 6/2002 |
| KR | 10-2001-0045939 | 6/2011 |
| KR | 10-2011-0075468 | 7/2011 |
| KR | 10-2015-0052429 | * 5/2015 |
| WO | 2006016662 | 2/2006 |

* cited by examiner

DISPLAY CIRCUITRY WITH REDUCED METAL ROUTING RESISTANCE

BACKGROUND

This relates generally to electronic devices, and more particularly, to electronic devices with displays.

In recent years, mobile electronic devices have become hugely popular due to their portability, versatility, and ease-of-use. Although there are many different types of mobile electronic devices, such as smart phones, portable music/video players, and tablet personal computers (PCs) currently available on the market, most of them share some basic components. In particular, touch sensor panels, touch screens, and the like have become available as input devices for various mobile electronic devices. Touch screens, in particular, are becoming increasingly popular because of their ease and versatility of operation. Touch screens can include a touch sensor panel, which can be a clear panel with a touch-sensitive surface, and a display device, such as an LCD panel or an OLED panel, that can be positioned partially or fully behind the touch sensor panel so that the touch-sensitive surface can cover at least a portion of the viewable area of the display device.

Given that the size of a typical mobile electronic device is relatively small compared to a laptop or desktop computer, it is often desirable to maximize the display area of mobile electronic devices. For devices with a touch screen, an increased display area can also provide a larger touch-active area. Typically, the display/touch-active area of a mobile electronic device is enclosed partially or fully by an inactive border area. This border area is often reserved for routing signals from the display and/or touch sensor panel to the circuitry of the device. Although the border area in some touch-based devices may already be relatively small compared to the display/touch-active area, further reducing the border area would nevertheless help maximizing the space available for the display/touch-active area of the device without increasing the overall size of the device.

It would therefore be desirable to be able to provide electronic displays with reduced border area.

SUMMARY

An electronic device having a liquid crystal display is provided. The liquid crystal display may include display pixel circuitry formed on a glass substrate. Thin-film transistor structures may be formed on the glass substrate. A passivation layer may be formed on the thin-film transistor structures (e.g., a silicon nitride passivation liner may be formed directly on top of the gate conductor of a thin-film transistor).

A dielectric liner (e.g., a thin silicon oxide layer) may be formed on the nitride passivation layer. A first low-k dielectric layer may be formed on the dielectric liner. A second low-k dielectric layer may be formed on the first low-k dielectric layer. The first and second low-k dielectric layers may be formed from materials having substantially similar indices of refraction to maximize backlight transmittance.

The display may include an array of display pixels arranged in rows and columns in an active region of the display. Each display pixel in the array may be coupled to associated control circuitry via conductive routing paths. For example, each thin-film transistor in each display pixel may be coupled to a corresponding data line that is routed to a display driver, to at least one corresponding gate line that is routed to a gate driver, and to a common electrode (Vcom) that is routed to a Vcom driver or an associated touch sensor/driver. The conductive routing paths coupling the data and gate lines to the associated driver circuits may be formed in an inactive border region of the display.

First conductive routing paths may be formed on the dielectric liner in the first low-k dielectric layer. Second conductive routing paths may be formed on the first low-k dielectric layer in the second low-k dielectric layer. The Vcom electrode and pixel storage capacitor circuitry may be formed on the second low-k dielectric layer. The first and second conductive routing paths may exhibit substantially similar sheet resistances. The TFT gate conductor that is formed below the passivation layer may be formed from high temperature resistant material exhibiting sheet resistances that are substantially greater than that of the first and second conductive routing paths formed in the first and second low-k dielectric layers, respectively (e.g., the gate conductive material may exhibit resistivity that is at least double that of the material used in forming the first and second conductive routing paths). In some arrangements, additional TFT gate conductors may be formed in the first low-k dielectric layer in the active display region to provide improved pixel addressing capabilities.

The use of routing paths in the first low-k dielectric layer reduces overall routing resistance. This enables the use of routing paths with reduced widths, which improves the peripheral routing capabilities of the display and reduces the inactive border area. The first and second conductive routing paths may also be interlaced to help reduce the fanout pitch of the wiring connecting the drivers to the associated row and column control lines in the display pixel array. Reducing wiring fanout pitch can also help reduce the inactive border region, thereby maximizing the active display region for enhanced usability.

Further features of the present invention, its nature and various advantages will be more apparent from the accompanying drawings and the following detailed description.

DETAILED DESCRIPTION

This relates to methods and circuitry for reducing the border areas of an electronic device so as to maximize the display/interactive touch areas of the device. In particular, additional metal routing structures can be formed between conventional M1 and M2 metal routing layers. The additional metal routing structures may exhibit substantially lower resistance than conductors formed in the M1 metal routing layer. The use of the additional metal routing structures can therefore help reduce routing resistance, which enables thinner routing paths to be formed and can also enable interlaced signal routing in conjunction with routing structures formed in the M2 metal routing layer. Forming thinner routing wires and interlacing routing paths (which reduces wire pitch) can help reduce the border areas on the electronic devices.

Figure 1:
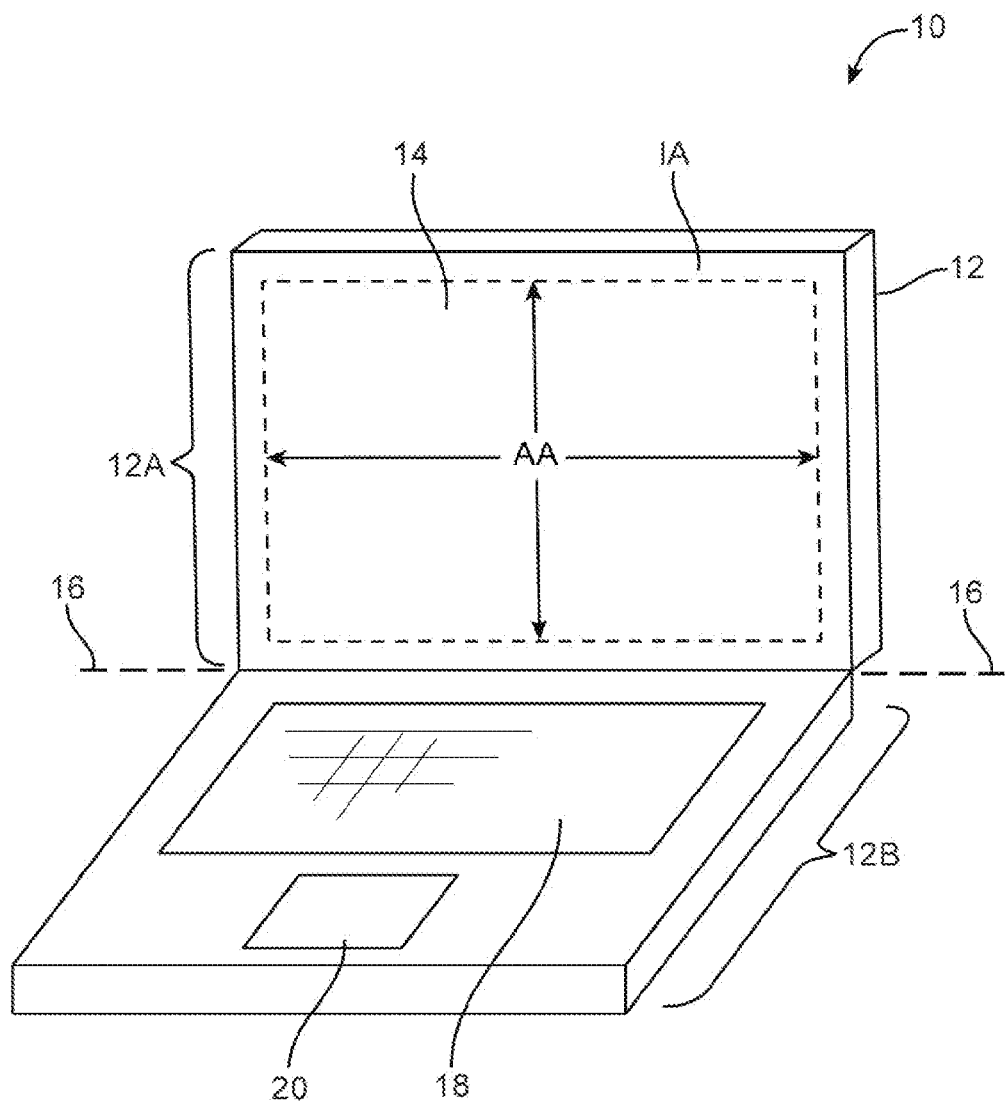
FIG. 1 is a diagram of an illustrative electronic device with a display such as a portable computer in accordance with an embodiment of the present invention.

An illustrative electronic device of the type that may be provided with a display is shown in FIG. 1. Electronic device 10 may be a computer such as a computer that is integrated into a display such as a computer monitor, a laptop computer, a tablet computer, a somewhat smaller portable device such as a wrist-watch device, pendant device, or other wearable or miniature device, a cellular telephone, a media player, a tablet computer, a gaming device, a navigation device, a computer monitor, a television, or other electronic equipment.

As shown in FIG. 1, device 10 may include a display such as display 14. Display 14 may be a touch screen that incorporates capacitive touch electrodes or other touch sensor components or may be a display that is not touch sensitive. Display 14 may include image pixels formed from liquid crystal display (LCD) components or other suitable display pixel structures. Arrangements in which display 14 is formed using liquid crystal display pixels are sometimes described herein as an example. This is, however, merely illustrative. Any suitable type of display technology may be used in forming display 14 if desired.

Device 10 may have a housing such as housing 12. Housing 12, which may sometimes be referred to as a case, may be formed of plastic, glass, ceramics, fiber composites, metal (e.g., stainless steel, aluminum, etc.), other suitable materials, or a combination of any two or more of these materials.

Housing 12 may be formed using a unibody configuration in which some or all of housing 12 is machined or molded as a single structure or may be formed using multiple structures (e.g., an internal frame structure, one or more structures that form exterior housing surfaces, etc.).

As shown in FIG. 1, housing 12 may have multiple parts. For example, housing 12 may have upper portion 12A and lower portion 12B. Upper portion 12A may be coupled to lower portion 12B using a hinge that allows portion 12A to rotate about rotational axis 16 relative to portion 12B. A keyboard such as keyboard 18 and a touch pad such as touch pad 20 may be mounted in housing portion 12B.

Display 14 may have an active area such as active area AA and an inactive area such as area IA. Active area AA may be, for example, a rectangular region in the center of display 14 in which display pixels are actively used to display images for a user of device 10. Inactive area IA may be devoid of active display pixels. In the example of FIG. 1, inactive area IA has the shape of a rectangular ring, surrounding the periphery of active area AA of display 14.

Circuitry and other components may sometimes be formed in inactive area IA. To hide the circuitry and other components from view by a user of device 10, inactive area IA may sometimes be provided with an opaque mask. The opaque mask can be formed from an opaque material such as a black pigmented polymer material or may be formed from opaque masking materials of other colors. Configurations in which the opaque masking material in display 14 has a black appearance are sometimes described herein as an example. This is, however, merely illustrative. Opaque masking layers in device 10 may have any suitable color.

Figure 2:
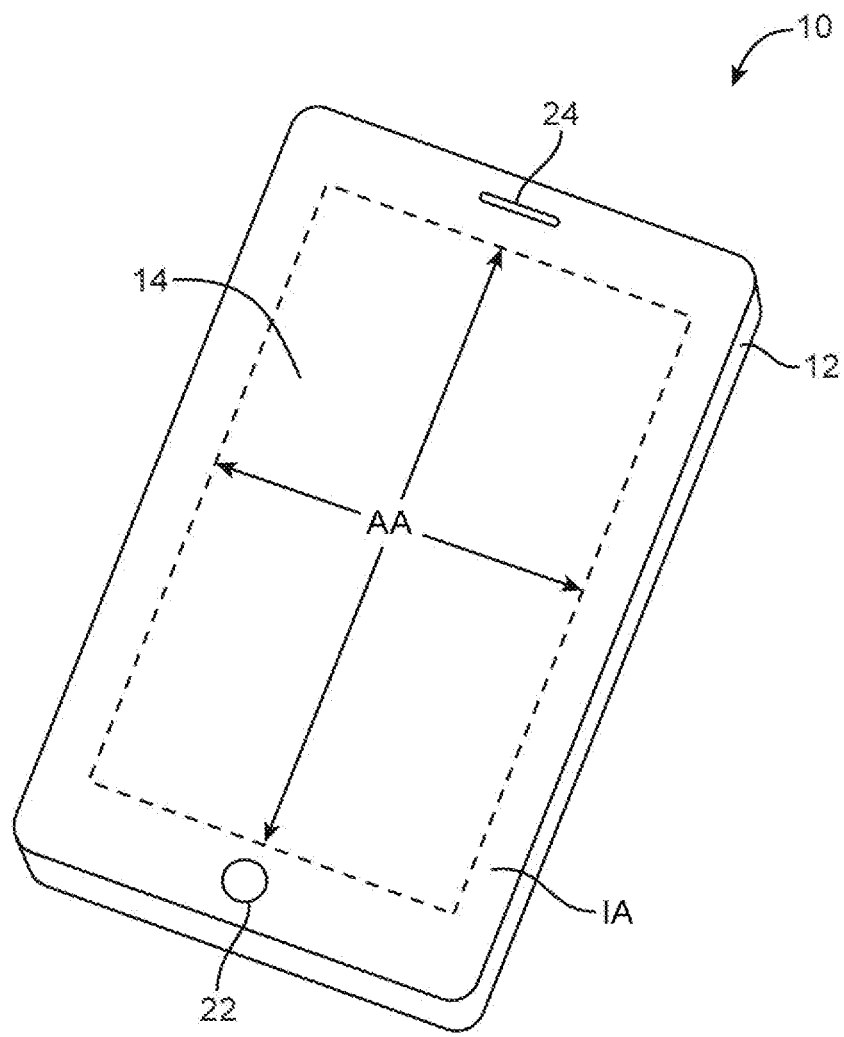
FIG. 2 is a diagram of an illustrative electronic device with a display such as a cellular telephone or other handheld device in accordance with an embodiment of the present invention.

In the example of FIG. 2, device 10 has been implemented using a housing that is sufficiently small to fit within a user's hand (e.g., device 10 of FIG. 2 may be a handheld electronic device such as a cellular telephone). As show in FIG. 2, device 10 may include a display such as display 14 mounted on the front of housing 12. Display 14 may be substantially filled with active display pixels or may have an inactive portion such as inactive portion IA that surrounds an active portion such as active portion AA. Display 14 may have openings (e.g., openings in inactive region IA or active region AA of display 14) such as an opening to accommodate button 22 and an opening to accommodate speaker port 24.

Figure 3:
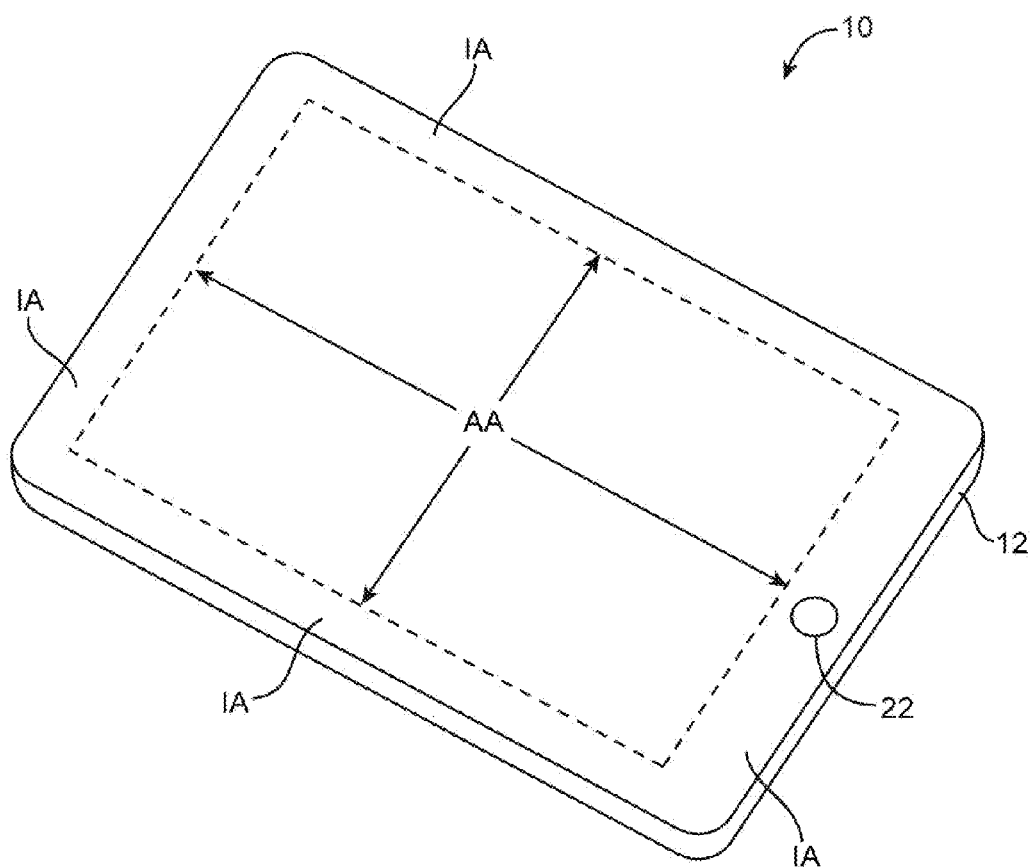
FIG. 3 is a diagram of an illustrative electronic device with a display such as a tablet computer in accordance with an embodiment of the present invention.

FIG. 3 is a perspective view of electronic device 10 in a configuration in which electronic device 10 has been implemented in the form of a tablet computer. As shown in FIG. 3, display 14 may be mounted on the upper (front) surface of housing 12. An opening may be formed in display 14 to accommodate button 22 (e.g., in inactive region IA surrounding active region AA).

Figure 4:
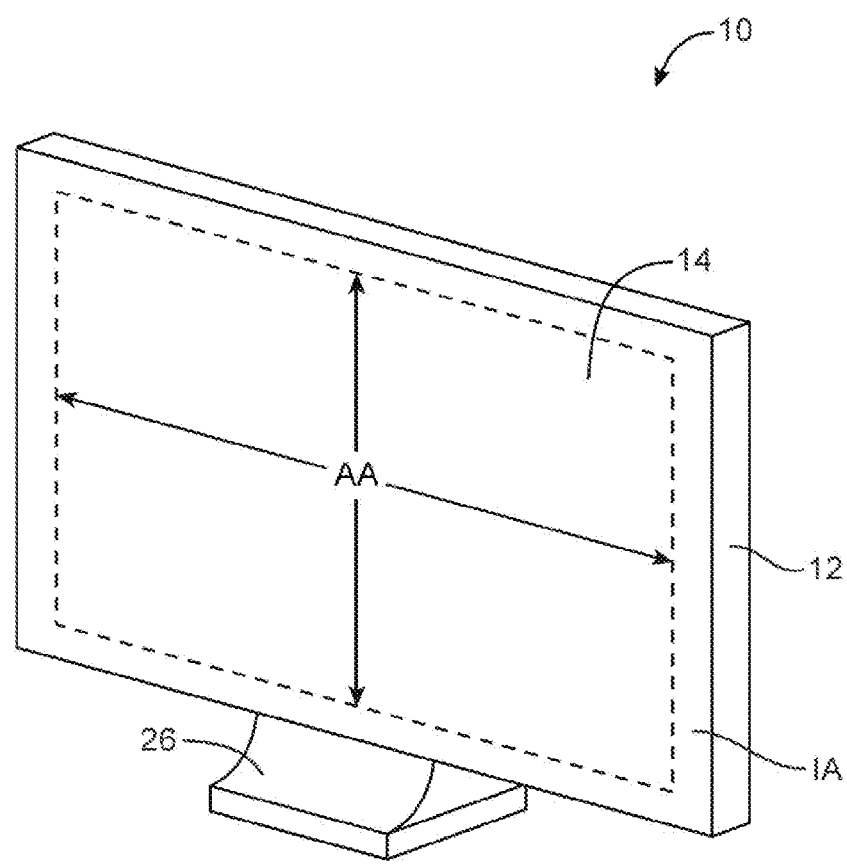
FIG. 4 is a diagram of an illustrative electronic device with a display such as a computer monitor with a built-in computer in accordance with an embodiment of the present invention.

FIG. 4 is a perspective view of electronic device 10 in a configuration in which electronic device 10 has been implemented in the form of a computer integrated into a computer monitor. As shown in FIG. 4, display 14 may be mounted on the front surface of housing 12. Stand 26 may be used to support housing 12. Display 14 may include an inactive region such as inactive region IA that surrounds active region AA.

If desired, display 14 may be configured so as to minimize or eliminate the size of inactive region IA along one or more edges of active region AA. Configurations in which inactive region IA extends along all four edges of a rectangular active region AA are described herein as an example.

Figure 5:
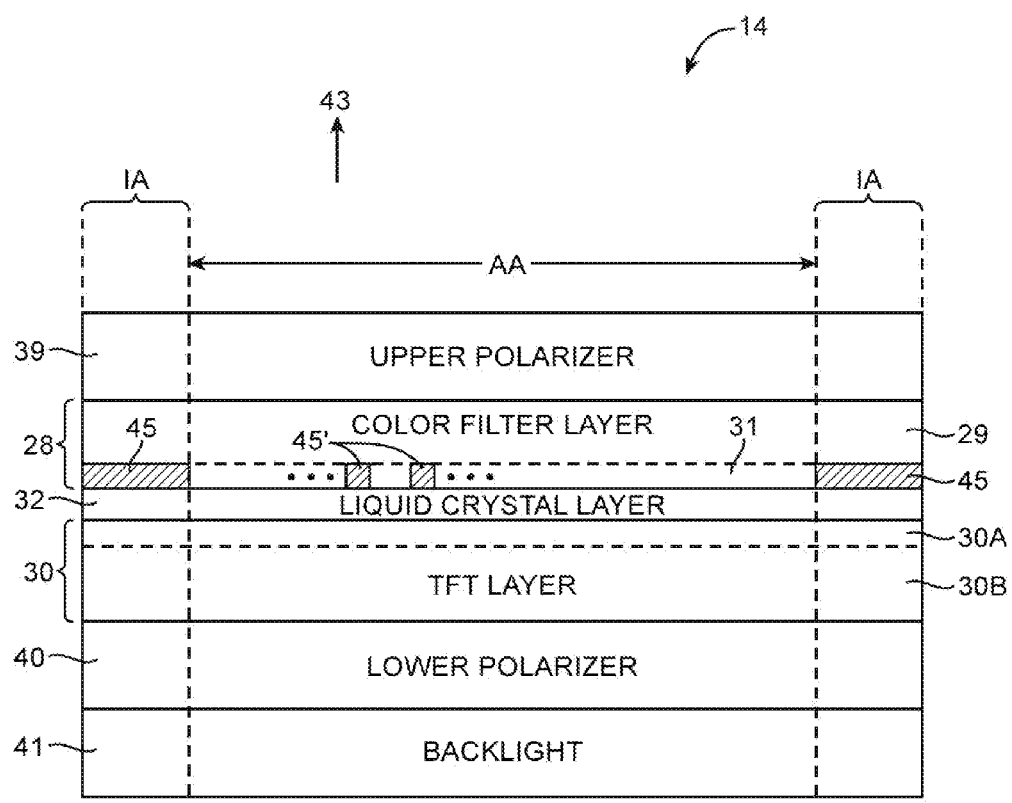
FIG. 5 is cross-sectional side view of a display in accordance with an embodiment of the present invention.

A cross-sectional side view of a portion of a display of the type that may be used in forming display 14 of FIGS. 1-4 is shown in FIG. 5. As shown in FIG. 5, display 14 may include color filter (CF) layer 28 and thin-film transistor (TFT) layer 30. Color filter layer 28 may include an array of color filter elements formed on a display substrate. As shown in FIG. 5, color filter array 31 may be formed on the interior surface of color filter substrate 29 in active area AA of display 14.

Color filter layer 28 may also include a layer of opaque masking material such as black masking material 45. Black masking material 45 (sometimes referred to as a black masking layer or black matrix layer) may be formed on the interior surface of color filter substrate 29 and may form an opaque peripheral border that surrounds active area AA of display 14. Opaque masking material such as black masking material 45' may also be formed inside active area AA of display 14. Black masking material 45' may be used in between adjacent colored pixels in active area AA to prevent color mixing. Black masking material that is used in the active portion of a display is sometimes referred to as a black matrix or black matrix layer. In a typical arrangement, black matrix layer 45' is provided with color filter element openings distributed throughout active area AA. Each opening may be provided with a color filter element (e.g., a red, green, or blue color filter element).

Liquid crystal (LC) layer 32 includes liquid crystal material and may be interposed between color filter layer 28 and thin-film transistor layer 30. Thin-film transistor layer 30 may include display circuitry 30A formed on a dielectric substrate such as TFT substrate 30B. Display circuitry 30A may include display driver circuitry (e.g., one or more display driver integrated circuits), thin-film transistor circuitry (e.g., polysilicon transistor circuitry or amorphous silicon transistor circuitry), metal lines, capacitors, electrodes for controlling the electric fields that are applied to liquid crystal layer 32, and capacitive touch sensor electrodes.

Suitable materials that may be used for display substrates 29 and 30B include planar glass substrates, plastic substrates, or sheets of other suitable substrate materials.

Display 14 may have upper and lower polarizer layers 39 and 40. Backlight unit 41 may provide backside illumination for display 14. Backlight 41 may include a light source such as a strip of light-emitting diodes. Backlight 41 may also include a light-guide plate and a back reflector. The back reflector may be located on the lower surface of the light-guide panel to prevent light leakage. Light from the light source may be injected into an edge of the light-guide panel and may scatter upwards in direction 43 through display 14.

An optional cover layer such as a layer of cover glass may be used to cover and protect the layers of display 14 that are shown in FIG. 5. Other layers that may be included in display 14 include optical film layers (e.g., structures such as quarter-wave plates, half-wave plates, diffusing films, optical adhesives, and birefringent compensating layers), shielding layers (e.g., for preventing electric fields from disrupting the operation of the display), heat sinking layers (e.g., for conducting heat away from the display), and other suitable display layers.

Touch sensor structures may be incorporated into one or more of the layers of display 14. In a typical touch sensor configuration, an array of capacitive touch sensor electrodes may be implemented using pads and/or strips of a transparent conductive material such as indium tin oxide. Other touch technologies may be used if desired (e.g., resistive touch, acoustic touch, optical touch, etc.). Indium tin oxide or other transparent conductive materials or non-transparent conductors may also be used in forming signal lines in display 14 (e.g., structures for conveying data, power, control signals, etc.). Touch sensor structures and circuitry may be included with display circuitry 30A on TFT substrate 30B.

In black and white displays, color filter layer 28 can be omitted. In color displays, color filter layer 28 can be used to impart colors to an array of image pixels. Each image pixel may, for example, have three corresponding subpixels. Each subpixel may be associated with a separate color filter element in color filter array 31. The color filter elements may, for example, include red (R) color filter elements, blue (B) color filter elements, and green (G) color filter elements. These elements may be arranged in rows and columns. For example, color filter elements can be arranged in stripes across the width of display 14 (e.g., in a repeating patterns such as a RBG pattern or BRG pattern) so that the color filter elements in each column are the same (i.e., so that each column contains all red elements, all blue elements, or all green elements). By controlling the amount of light transmission through each subpixel, a desired colored image can be displayed.

The amount of light transmitted through each subpixel can be controlled using display control circuitry and electrodes. Each subpixel may, for example, be provided with a transparent indium tin oxide electrode. The signal on the subpixel electrode, which controls the electric field through an associated portion of the liquid crystal layer and thereby controls the light transmission for the subpixel, may be applied using a thin-film transistor. The thin-film transistor may receive data signals from data lines and, when turned on by an associated gate line, may apply the data line signals to the electrode that is associated with that thin-film transistor.

Other configurations may be used for electronic device 10 and display 14 if desired. The examples of FIGS. 1-5 are merely illustrative.

Figure 6:
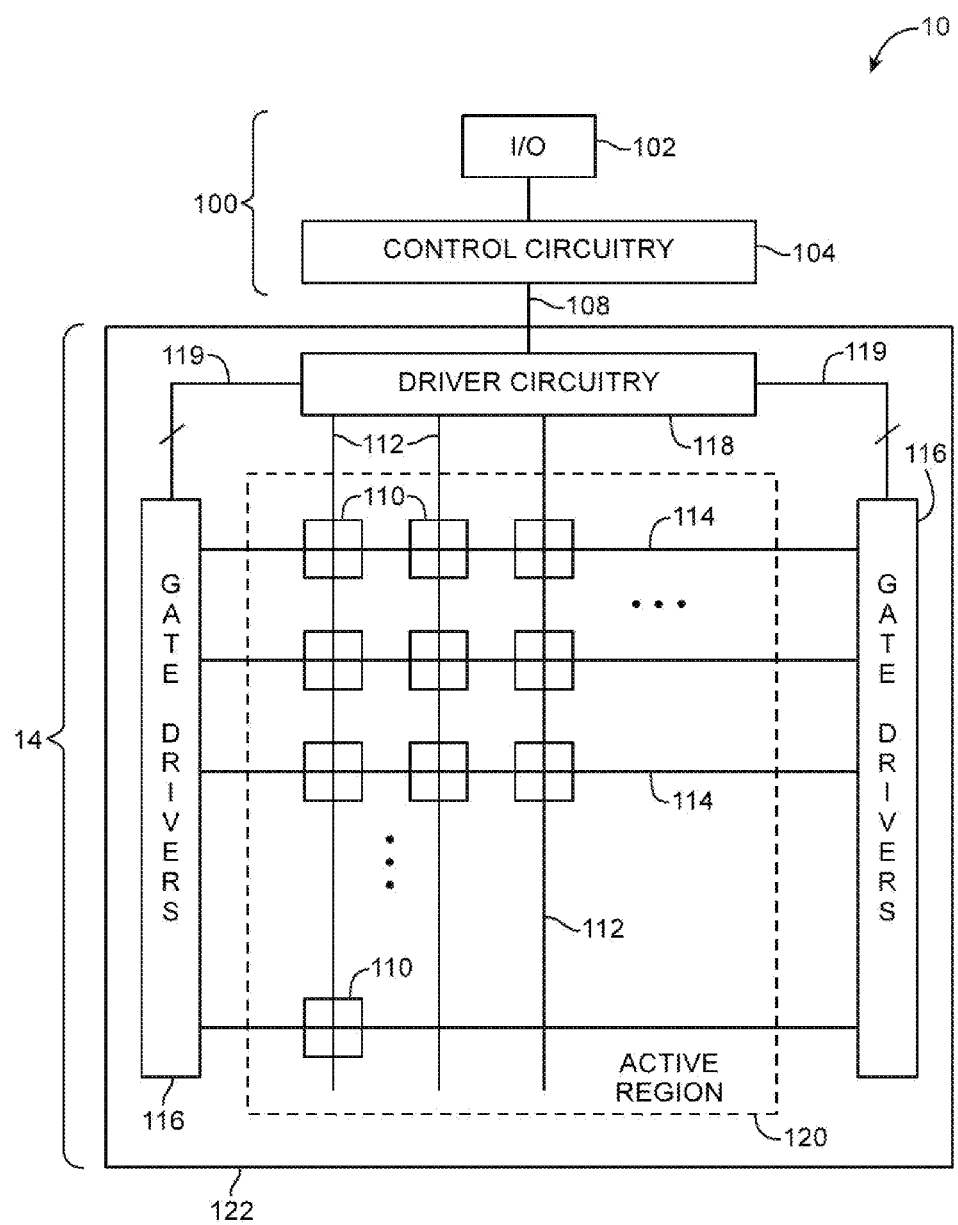
FIG. 6 is a circuit diagram showing circuitry that may be used in operating an electronic device display in accordance with an embodiment of the present invention.

A diagram showing circuitry of the type that may be used in display 14 and device 10 is shown in FIG. 6. As shown in FIG. 6, display 14 may be coupled to device components 100 such as input-output circuitry 102 and control circuitry 104. Input-output circuitry 102 may include components for receiving device input. For example, input-output circuitry 102 may include a microphone for receiving audio input, a keyboard, keypad, or other buttons or switches for receiving input (e.g., key press input or button press input from a user), sensors for gathering input such as an accelerometer, a compass, a light sensor, a proximity sensor, touch sensor (e.g., touch sensors associated with display 14 or separate touch sensors), or other input devices. Input-output circuitry 102 may also include components for supplying output. Output circuitry may include components such as speakers, light-emitting diodes or other light-emitting devices for producing light output, vibrators, and other components for supplying output. Input-output ports in circuitry 102 may be used for receiving analog and/or digital input signal and may be used for outputting analog and/or digital output signals. Examples of input-output ports that may be used in circuitry 102 include audio ports, digital data ports, ports associated with 30-pin connectors, 9-pin connectors, reversible connectors, and ports associated with Universal Serial Bus connectors and other digital data connectors.

Control circuitry 104 may be used in controlling the operation of device 10. Control circuitry 104 may include storage circuits such as volatile and non-volatile memory circuits, solid state drives, hard drives, and other memory and storage circuitry. Control circuitry 104 may also include processing circuitry such as processing circuitry in a microprocessor or other processor. One or more integrated circuits may be used in implementing control circuitry 104. Examples of integrated circuits that may be included in control circuitry 104 include microprocessors, digital signal processors, power management units, baseband processors, microcontrollers, application-specific integrated circuits, circuits for handling audio and/or visual information, and other control circuitry.

Control circuitry 104 may be used in running software for device 10. For example, control circuitry 104 may be configured to execute code in connection with the displaying of images on display 14 (e.g., text, pictures, video, etc.).

Display 14 may include a pixel array such as pixel array 122. Pixel array 122 may be controlled using control signals produced by display driver circuitry such as display driver circuitry 118. Display driver circuitry 118 may be implemented using one or more integrated circuits (ICs) and may sometimes be referred to as a driver IC, display driver integrated circuit, or display driver. Pixel array 122 may be formed from thin-film transistor circuitry on a substrate such as a layer of glass. The glass layer may sometimes be referred to as a thin-film transistor layer or thin-film transistor substrate layer. A display driver integrated circuit for circuitry 118 may be mounted on an edge of the thin-film transistor substrate (as an example).

During operation of device 10, control circuitry 104 may provide data to display driver 118. For example, control circuitry 104 may use a path such as path 108 to supply display driver 118 with digital data corresponding to text, graphics, video, or other images to be displayed on display 14. Display driver 118 may convert the data that is received on path 108 into signals for controlling the pixels of pixel array 122. The signals for controlling the pixels of pixel array 122 may be provided to gate driver circuitry such as gate driver circuitry 116 using paths such as paths 119.

Pixel array 122 may contain rows and columns of display pixels 110 that collectively form an active display region 120 (sometimes referred to as the active area of display 14). Gate driver circuitry 116 and driver circuitry 118 may be located in an inactive border region surrounding active display region 120. The circuitry of pixel array 122 may be controlled using signals such as data line signals on data lines 112 and gate line signals on gate lines 114.

Pixels 40 in pixel array 122 may contain thin-film transistor circuitry such as polysilicon transistor circuitry, amorphous silicon transistor circuitry, or oxide-based transistor circuitry (e.g., InGaZnO transistors) and associated structures for producing electric fields across liquid crystal material in display 14. The thin-film transistor structures that are used in forming pixels 40 may be located on a substrate (sometimes referred to as a thin-film transistor layer or thin-film transistor substrate). The thin-film transistor (TFT) layer may be formed from a planar glass substrate, a plastic substrate, or a sheet of other suitable substrate materials.

Gate driver circuitry 116 may be used to generate gate signals on gate lines 114. Circuits such as gate driver circuitry 116 may be formed from thin-film transistors on the thin-film transistor layer (e.g., from polysilicon transistor circuitry, amorphous silicon transistor circuitry, or oxide-based transistor circuitry such as InGaZnO transistors). For example, if the thin-film transistors of display pixels 110 are formed from InGaZnO transistors, the thin-film transistors of gate driver circuitry 116 may also be formed form InGaZnO transistors. Gate driver circuitry 116 may be located on both the left and right sides of pixel array 122 (as shown in FIG. 6) or may be located on only one side of pixel array 122.

The data line signals in pixel array 122 carry analog image data (e.g., voltages with magnitudes representing pixel brightness levels). During the process of displaying images on display 14, display driver circuitry 118 may receive digital data from control circuitry 104 via path 108 and may provide corresponding data signals to paths 112.

The data line signals on data lines 112 may be provided to the columns of display pixels 110 in pixel array 122. Gate line signals may be provided to the rows of pixels 110 in pixel array 122 by gate driver circuitry 116 using respective gate lines 114. The terms "rows and "columns" used in describing the way in which display pixels 110 in array 122 are arranged are merely illustrative and are interchangeable. In general, pixels 110 in display 14 may be organized in any suitable arrangement.

Figure 7:
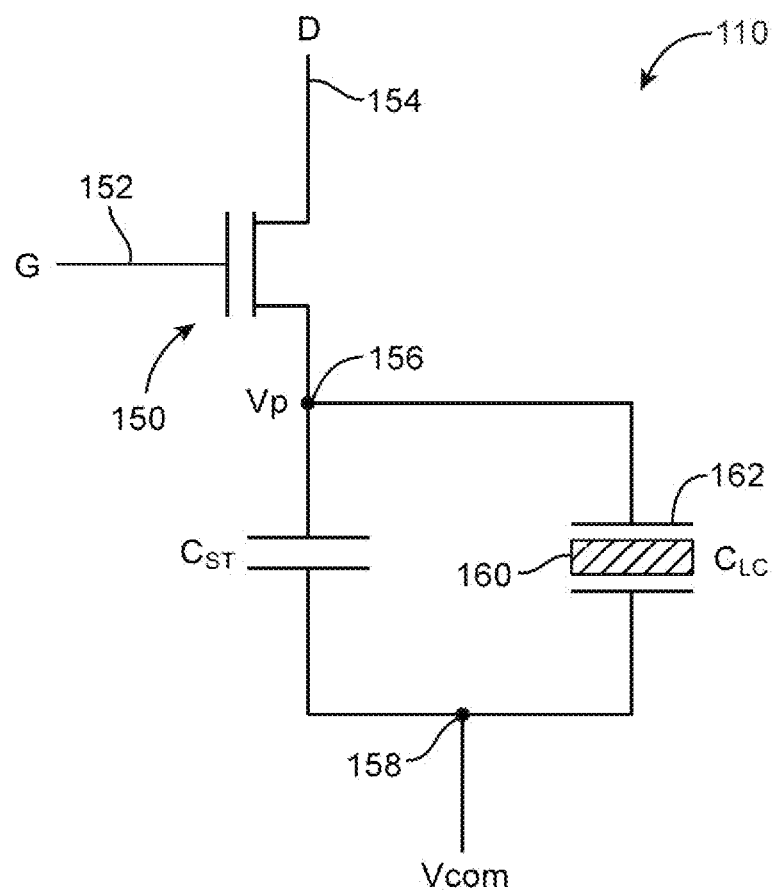
FIG. 7 is a circuit diagram of an illustrative display pixel in a display in accordance with an embodiment of the present invention.

FIG. 7 is a circuit diagram of an illustrative display pixel 110 in pixel array 122. Pixels such as pixel 110 of FIG. 7 may be located at the intersection of each gate line 114 and data line 112 in array 122.

A data signal D may be supplied to terminal 154 from one of data lines 112 (FIG. 6). A thin-film transistor such as thin-film transistor 150 may have a gate terminal such as gate 152 that receives gate line signal G from gate driver circuitry 116 (FIG. 6). When signal G is asserted, transistor 150 will be turned on and signal D will be passed to node 156 as voltage Vp. Data for display 14 may be displayed in frames. Following assertion of signal G in one frame, signal G may be deasserted. Signal G may then be asserted to turn on transistor 52 and capture a new value of Vp in a subsequent display frame.

Display 14 may have a common electrode coupled to node 158. The common electrode (which is sometimes referred to as the Vcom electrode) may be used to distribute a common electrode voltage such as common electrode voltage Vcom to nodes such as node 158 in each pixel 110 of array 122. Pixel 110 may have a signal storage element such as capacitor $C_{ST}$ or other charge storage element. Storage capacitor $C_{ST}$ may be coupled between nodes 156 and 158. A parallel plate capacitance $C_{LC}$ may be formed across nodes 156 and 158 due to electrode structures in pixel 110 that are used in controlling the electric field through the liquid crystal material of the pixel (liquid crystal material 160). As shown in FIG. 7, electrode structures 162 may be coupled to node 156. Capacitance $C_{LC}$ is associated with the capacitance between electrode structures 162 and common electrode Vcom at node 158.

Data lines 112 and the gate line signals on gate lines 114 (which are coupled to gates such as gate G of FIG. 7) are used to charge pixels 110 (e.g., to charge capacitance $C_{ST}$ and CO. Once a pixel 110 has been charged, electrode structures 162 may apply a controlled electric field (i.e., an electric field having a magnitude proportional to the difference between Vp and Vcom) across a pixel-sized portion of liquid crystal material 160 in pixel 110. The capacitance associated with storage capacitor $C_{ST}$ may be used in storing signal Vp between frames (i.e., in the period of time between the assertion of successive signals G). Due to the presence of storage capacitor $C_{ST}$ (and capacitance $C_{LC}$ the value of Vp (and therefore the associated electric field across liquid crystal material 160) may be maintained across nodes 156 and 158 for the duration of each frame.

The electric field that is produced across liquid crystal material 160 causes a change in the orientations of the liquid crystals in liquid crystal material 160. This changes the polarization of light passing through liquid crystal material 160. The change in polarization may be used in controlling the amount of light that is transmitted through each pixel 110 in array 122.

Figure 8:
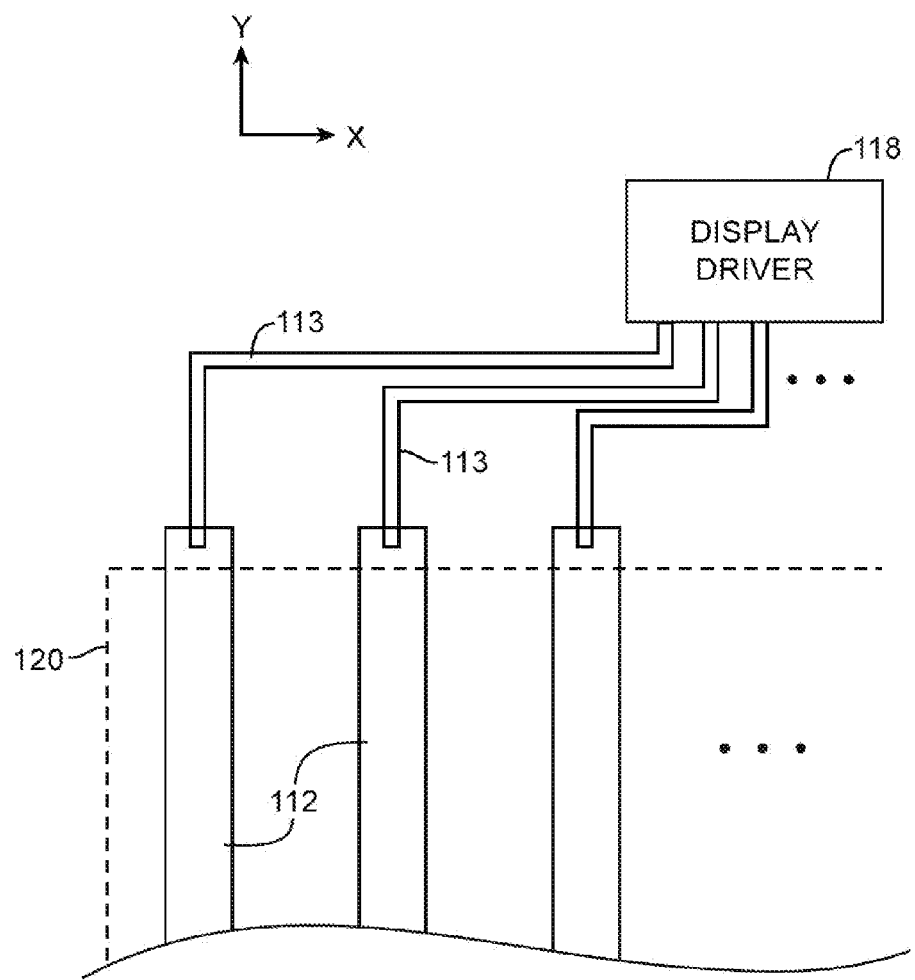
FIG. 8 shows a magnified view of a section of the illustrative display circuitry of FIG. 6 in accordance with an embodiment of the present invention.

FIG. 8 provides a magnified view of a portion of display 14 of FIG. 6. In particular, FIG. 8 shows how the data lines 112 can extend beyond the edge of the active area 120 indicated by the dotted lines. Each data line 112 can be connected to display driver 118 via a respective metal routing path 113. Metal traces 113 of this type can be routed in the inactive border area IA. To prevent the metal traces 113 from crossing each other's path, each of traces 113 can be first routed in the x-direction (i.e., along the width) of the device in various lengths and then in parallel in the y-direction (i.e., along the length) of the device, as shown in FIG. 8. This requires that the border area of the device be wide enough to accommodate all the peripheral metal routing 113. For this reason, the border region can take up a significant area on the surface of device 10. This configuration in which a driver IC has to drive signals onto multiple routing traces distributed across the width or length of a device is sometimes referred to as routing "fanout."

High-resolution displays will require a relatively large fanout, which can negatively affect the space that can be used as the active area (i.e., the display/touch-active area) in a device with fixed overall dimensions. The same issue can be caused by the routing traces for the touch panel. Thus, to provide better usability, it may be desirable to reduce the border area in devices such as the ones shown in FIGS. 1-4 to maximize its active area. In other words, by narrowing the border area, the display and touch screen of the device can be made larger.

Figure 9:
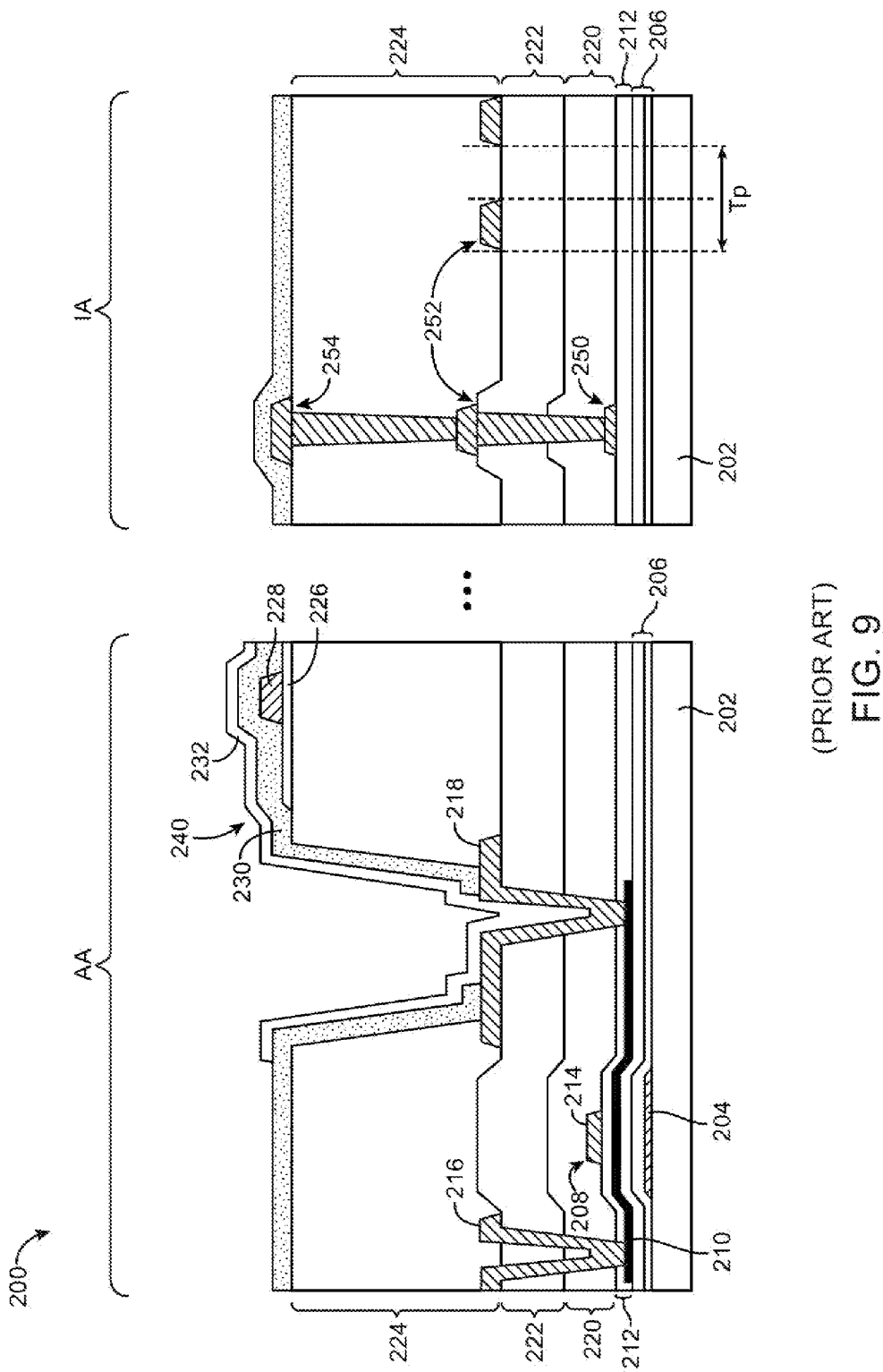
FIG. 9 is a cross-sectional side view of conventional display pixel circuitry that includes only M2 routing structures.

FIG. 9 shows a cross-sectional side view of conventional display pixel and associated routing structures 200 that can be formed in the thin-film transistor layer of the display. As shown in FIG. 9, a thin-film transistor 208 is formed on a glass substrate 202. A metal light shield 204 is often formed on glass substrate 202 directly beneath thin-film transistor 208 to prevent backlight from potentially interfering with the operation of thin-film transistor 208.

One or more buffer layers 206 can then formed on glass substrate 202 over light shield 204. Polysilicon 210 is patterned on buffer layers 206 to form an active area for transistor 208. Gate insulating material 212 is formed on buffer layers 206 over polysilicon 210. A metal gate conductor 214 is formed on gate insulating layer 212 and serves as the gate terminal for transistor 208. A silicon nitride layer 220 is formed on gate insulating material 212 over gate 214.

A silicon oxide layer 222 is then formed on silicon nitride layer 220. Metal contact structures 216 and 218 are formed through layers 222, 220, and 212 to make contact with polysilicon 210. In the diagram of FIG. 9, the portion of polysilicon 210 that is coupled to contact 216 serves as a first source-drain terminal for transistor 208 that is coupled to a corresponding data line (i.e., contact 216 is connected to metal routing paths on which analog image data signals are provided), whereas the portion of polysilicon 210 that is coupled to contact 218 serves as a second source-drain terminal for transistor 208 that is coupled to a corresponding pixel node (i.e., contact 218 is connected to pixel electrode structures on which image data signals are temporarily stored).

An acrylic organic planarization layer 224 is formed on silicon oxide layer 222. A common electrode (Vcom) layer 226 is formed on planarization layer 224. A metal routing conductor 228 is formed on Vcom layer 226. An opening is formed in planarization layer 224 to form an electrical connection between contact 218 and a pixel electrode layer 232 (i.e., to form a display pixel contact). Insulating material 230 is interposed between pixel electrode layer 232 and common electrode layer 226. A display pixel storage capacitor 240 is formed from Vcom electrode 226 and a portion of pixel electrode 232 that overlaps with the Vcom electrode (i.e., Vcom layer 226 and the portion of pixel electrode layer 232 that directly faces Vcom layer 226 are separated by insulating material 230 and serve collectively as the storage capacitor for the display pixel). Common electrode layer 226 and pixel electrode layer 232 are typically formed from indium tin oxide, a transparent material that allows backlight to pass through to the liquid crystal material above the thin-film transistor layer.

Typically, the thin-film transistors 208 and associated pixel and Vcom electrodes are formed in the active area AA portion of display 14. The routing between the display pixel array circuitry in active area AA and the associated control circuitry (i.e., the display driver, the gate line drivers, touch driver and sensor circuitry, etc.) are formed with inactive border area IA. As shown in FIG. 9, metal routing structures 250 can be formed on gate insulating layer 212 in silicon nitride layer 220; metal routing structures 252 can be formed on oxide layer 222 in planarization layer 224; and metal routing structures 254 can be formed on planarization layer 224. The layer in which metal routing structures 250 are formed is generally referred to as the "M1" metal routing layer. The layer in which metal routing structures 252 are formed is generally referred to as the "M2" metal routing layer. The layer in which metal routing structures 254 are formed is generally referred to as the "M3" metal routing layer. The material used in forming routing structures 250, 252, and 254 is therefore sometimes referred to as M1 metal, M2 metal, and M3 metal, respectively.

In conventional TFT-based displays, the M1 metal needs to be formed from high temperature resistant material in order to be able to sustain high temperature annealing processes applied to the TFT structures after formation of the M1 metal. High temperature resistant materials, however, suffer from high resistivity. For example, M2 and M3 metals may exhibit sheet resistances that are less than 0.2 Ohms/square, whereas the high temperature resistance M1 metal may exhibit sheet resistances that are greater than 0.4 Ohms/square (i.e., the resistivity of M1 metal can be more than double that of M2 metal and M3 metal). High M1 resistance generally requires metal routing paths in the M1 layer to be relatively wider to compensate for the high resistivity, which undesirably increases routing area.

In general, the display inactive border can be reduced by decrease the routing fanout pitch (i.e., by decreasing the distance between adjacent metal routing wires). Still referring to FIG. 9, the pitch of the M2 routing paths is indicated by distance Tp. The minimum allowed pitch Tp is set by the current TFT fabrication technology, which limits the density of the fanout wires. One way of reducing metal fanout pitch is via interlaced metal routing. Interlaced metal routing requires different associated signals to be routed in both M1 and M2 layers so as to reduce the effective pitch between adjacent wires. The sheet resistances of the M1 and M2 metal are, however, too different to satisfy the routing resistance requirements of interlaced routing (i.e., interlaced routing requires the interlacing metal paths in the different metal routing layers to have substantially similar sheet resistances to satisfy routing performance requirements).

The following paragraphs introduce various embodiments of this disclosure that can minimize the inactive border area of a device without increasing its overall dimensions so that a larger area of the device surface can be used as the active area for display and/or receiving touch-based input. In various embodiments, this can be achieved by forming additional metal routing structures between the M1 and M2 metal routing layers.

Figure 10:
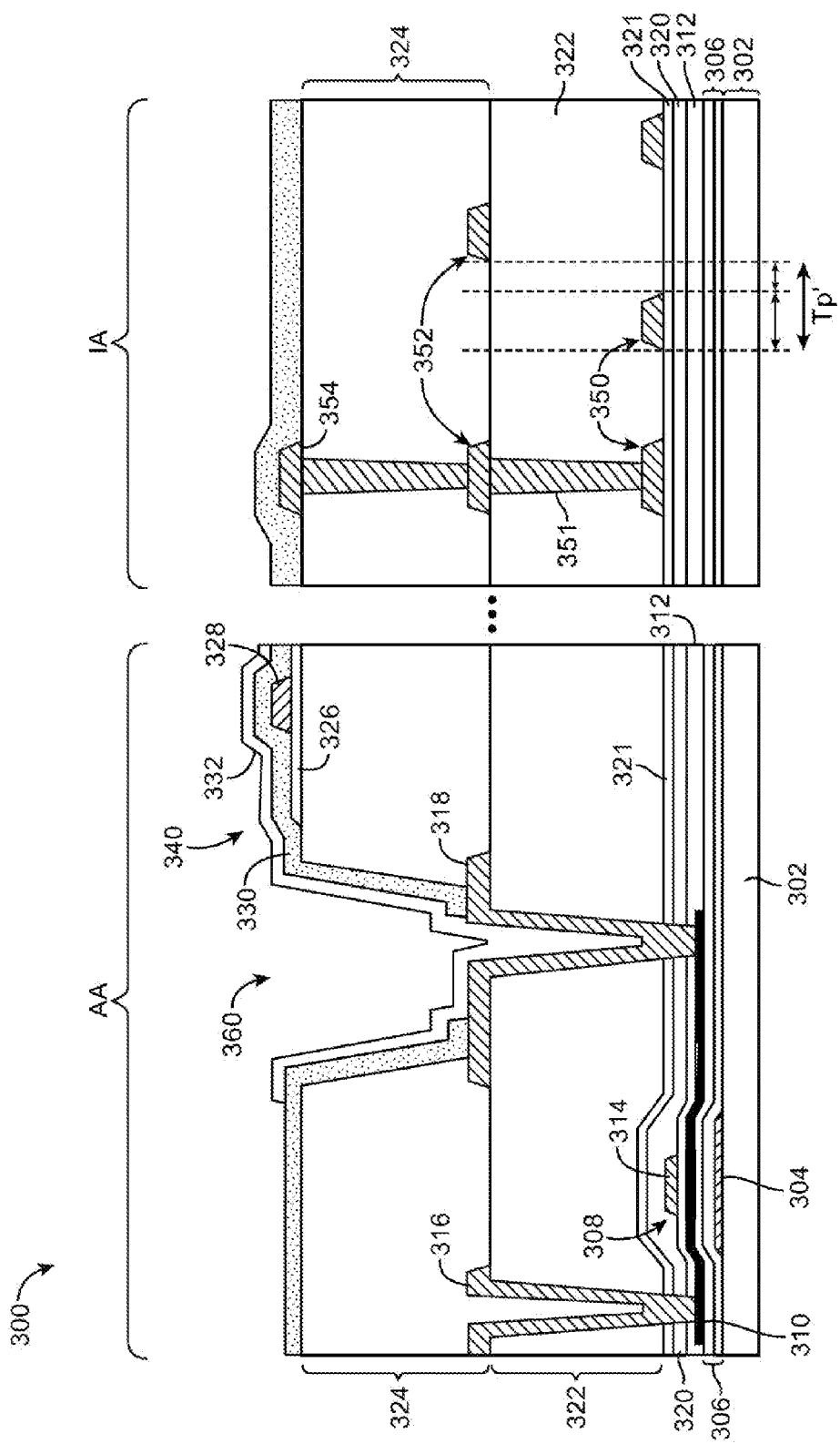
FIG. 10 is a cross-sectional side view of illustrative display pixel circuitry that includes additional routing structures above M1 gate structures and below M2 routing structures in accordance with an embodiment of the present invention.

In accordance with an embodiment of the present invention, display pixel and associated routing structures 300 exhibiting improved metal routing capabilities compared to the conventional TFT display structures of FIG. 9 is provided (see, e.g., FIG. 10). As shown in FIG. 10, thin-film transistor structures such as thin-film transistor 308 may be formed on a transparent substrate 302 made from as glass or other dielectric material. Thin-film transistor 308 may serve as the display pixel thin-film transistor 150 that is described in connection with FIG. 7.

Light shielding structures such as light shield 304 may be formed on substrate 302 directly beneath transistor 308 and may serve to prevent backlight from interfering with the operation of transistor 308. One or more buffer layers such as buffer layers 306 may be formed on substrate 302 and over light shield 304. Buffer layers 306 may be formed from any suitable transparent dielectric material.

Active material 310 for transistor 308 may be formed on buffer layers 306. Active material 310 may be a layer of amorphous silicon or polysilicon (as examples). A gate insulating layer such as gate insulating layer 312 may be formed on buffer layers 306 and over the active material. A conductive gate structure such as gate conductor 314 may be disposed over gate insulator 312. Gate conductor 314 may serve as the gate terminal for thin-film transistor 308. The portion of active material 310 directly beneath gate 314 may serve as the channel region for transistor 308.

A passivation layer such as a silicon nitride layer 320 may be formed on gate insulating layer 312 and over gate 314. After deposition of layer 320, a hydrogenation annealing process may be applied to passivate thin-film transistor structures 308. The material with which gate 314 is formed is sometimes referred to as "M1" metal. As a result, layer 320 in which gate conductor 314 is formed may sometimes be referred to as a first metal (M1) routing layer.

An oxide layer such as silicon oxide liner 321 may be formed on passivation layer 320. Layer 321 may serve as an etch-stop layer during formation of metal structures on layer 321. A low-k dielectric layer 322 (e.g., a layer formed from dielectric material having a dielectric constant K less than that of silicon dioxide) may be formed on layer 321. Layer 322 may be formed from acrylic, photoresist or other light-sensitive material, siloxane-based polymer, silicon-based dielectric, organic material, a combination of these materials, and/or any suitable low-k dielectric materials.

Transistor source-drain contact structures such as structures 316 and 318 may be formed through layer 322 to make electrical contact with transistor active material 310. Contact structures 316 and 318 are sometimes referred to as "via" structures. In particular, the portion of active material 310 that makes contact with via 316 may serve as a first source-drain region for transistor 308, whereas the portion of active material 310 that makes contact with via 318 may serve as a second source-drain region for transistor 308. Thin-film transistors in which the gate conductor is formed above the active source-drain regions are generally referred to as "top-gate" thin-film transistors. This is merely illustrative. If desired, pixel 300 may be formed using "bottom-gate" thin-film transistor arrangements in which the gate conductor is formed below the active source-drain regions.

Metal routing structures sometimes referred to as "M2" metal routing paths may be formed on layer 322 to connect the transistor source-drain terminals to other display pixel circuitry. As an example, a first M2 metal routing path formed on layer 322 may be used to connect via 316 to a corresponding data line (e.g., data line D in FIG. 7), whereas a second M2 metal routing path formed on layer 322 may be used to connect via 318 to a corresponding pixel electrode node (see, e.g., node 156 on which pixel voltage Vp is stored in FIG. 7).

Another low-k dielectric layer such as layer 324 may be formed on layer 322. Layer 324 may serve as a planarization layer and may sometimes be referred to as a second metal (M2) routing layer. Similar to layer 322, layer 324 may be formed from acrylic, photoresist or other light-sensitive material, siloxane-based polymer, silicon-based dielectric, organic material, a combination of these materials, and/or any suitable low-k dielectric materials. In general, layers 322 and 324 should be formed from the same material or materials having substantially similar indices of refraction so as to maximize the transmittance of backlight propagating through these dielectric layers (e.g., the indices of refraction should differ by no more than 0.1, by no more than 0.08, by no more than 0.05, by no more than 0.01, etc.).

A common electrode layer such as Vcom layer 326 may be formed on low-k dielectric planarization layer 324. Common electrode layer 326 may be formed as a blanket film of transparent conductive material that covers the entirely of the display pixel array, as separate Vcom regions interconnected by additional routing paths, or in other patterns (e.g., in horizontal and vertical strips of transparent conductive material) that support capacitive touch sensing technologies. Additional Vcom routing structures 328 (sometimes referred to as "M3" metal routing paths) may be formed on Vcom layer 326 to connect the Vcom electrode to other display circuitry (e.g., to interconnect different Vcom layers, to connect the Vcom layer to associated Vcom driver circuitry, to connect the Vcom layer to touch sensor circuitry, etc.).

An opening may be formed in planarization layer 324 to form an electrical connection between via 318 and a pixel electrode layer 332 to form a display pixel contact 360 (e.g., a contact that connects the storage capacitor to thin-film transistor 308). Pixel electrode layer 332 may be patterned to form finger-shaped electrodes (not shown in FIG. 10) that apply electric fields to the liquid crystal material 160 (FIG. 7). Insulating material 330 may be formed between pixel electrode layer 332 and common electrode layer 326. Vcom electrode 326 and a portion of pixel electrode 332 that overlaps with Vcom electrode 326 may form storage capacitor 340 (e.g., the storage capacitor may include Vcom layer 326, the portion of pixel electrode layer 332 that directly faces Vcom layer 326, and insulating material 330 interposed between the two opposing parallel conductors).

In general, common electrode 326 and pixel electrode 332 may be formed from indium tin oxide or other suitable transparent material that allows backlight to pass through to the liquid crystal material above the thin-film transistor layer. Light shielding structures 304 and the M1 gate structures may be formed from high temperature resistant material such as molybdenum, tungsten, a combination of the two, and/or other suitable high temperature resistant materials. Vias 316 and 318 and the M2 and M3 metal routing structures may be formed from copper, aluminum, silver, gold, tungsten, nickel, other metals, a combination of these materials, and/or other conductive material suitable for routing data and control signals in display 14.

Typically, the thin-film transistors 308 and associated pixel and Vcom electrodes are formed in the active area AA portion of display 14. The routing between the display pixel array circuitry in active area AA and the associated control circuitry (e.g., the display driver, the gate line drivers, touch driver and sensor circuitry, etc.) are formed within inactive border area IA. As shown in FIG. 10, gate conductor 314 can be formed on gate insulating layer 312 in passivation layer 320; metal routing structures 350 can be formed on etch-stop layer 321 in low-k dielectric layer 322; metal routing structures 352 can be formed on low-k dielectric layer 322 in low-k dielectric planarization layer 324; and metal routing structures 354 can be formed on planarization layer 324.

The layer in which gate structures 314 are formed is generally referred to as the "M1" or the first/bottommost metal routing layer. The layer in which metal routing structures 352 are formed is generally referred to as the "M2" or second metal routing layer. The layer in which metal routing structures 354 are formed is generally referred to as the "M3" or third metal routing layer. Metal routing paths 350 represent additional metal routing structures that are formed between the M1 and M2 metal routing layers. Layer 322 in which metal routing paths 350 are formed may therefore sometimes be referred to as an intermediate routing layer or a sub-M2 (or "M2s") metal routing layer. The material used in forming routing structures 350, 352, and 354 is therefore sometimes referred to as M2s metal, M2 metal, and M3 metal, respectively. Metal routing layers formed over the M3 metal routing layer, if present, are generally referred to as sequentially as the M4 metal routing layer, M5 metal routing layer, M6 metal routing layer, etc.

As described above, M1 routing structures are formed from high temperature resistant material that exhibit high resistivity. It may therefore be desirable to perform signal routing using conductive paths form in metal routing layers other than the M1 metal routing layer. Because the M2s metal routing structures 350 are formed over passivation layer 320 (e.g., the high temperature annealing process is performed prior to formation of the M2s routing structures), the M2s metal need not be formed using high temperature resistant material and can instead be formed using the same low-resistivity material that is used in forming the M2 and M3 metal routing paths. For example, the M2s, M2, and M3 metal routing structures can be formed from copper, aluminum, silver, gold, nickel, a combination of these materials, and/or other conductive material that exhibits low sheet resistance (i.e., materials having sheet resistances of less than 0.4 Ohms/square, of less than 0.2 Ohms/square, of less than 0.05 Ohms/square, of less than 0.01 Ohms/square, etc.) and is suitable for routing data and control signals in display 14. The M2s and M2 metal may exhibit substantially similar resistivity levels. For example, the M2s and M2 metal routing paths may both exhibit a sheet resistance of 0.047 Ohms/square. Forming M2s metal routing structures in this way provides an additional metal routing layer in which conductive paths with low resistivity can be formed, which increases overall routing capability for the TFT display/touch structures.

When M2 and M2s metal routing paths are used in parallel to carry the same signal, thinner individual routing paths can be formed since the use of two separate paths to convey the same signal significantly reduces the routing resistance. As shown in FIG. 10, at least some conductive routing paths 350 formed in layer 322 and conductive routing paths formed on layer 322 are shorted in parallel using vias 351 formed through layer 322. In general, the use of metal routing paths with reduced widths can help reduce fanout pitch, which reduces the inactive border area.

In scenarios in which adjacent M2 and M2s metal routing paths are used to carry different signals, interlaced metal routing can be implemented. To implement interlaced metal routing, a first routing path 350 may be formed in the M2s routing layer (e.g., layer 322), and a second routing path 352 may be formed in the M2 routing layer (e.g., layer 324) as close to the first routing path 350 as possible without experiencing excessive parasitic coupling effects. More than two metal routing paths can be formed in the M2s and M2 layers using this approach. Arranged in this way, the effective pitch Tp' between adjacent routing wires in area IA of circuitry 300 is less than the pitch Tp between adjacent routing wires formed in the M2 layer in area IA of circuitry 200 as described in connection with FIG. 9 (e.g., the ability to form adjacent metal routing paths in different layers as opposed to only forming adjacent metal routing paths in the same layer reduces the effective wiring pitch). Decreasing pitch via interlaced routing can enable further minimization of the inactive border area.

Figure 11:
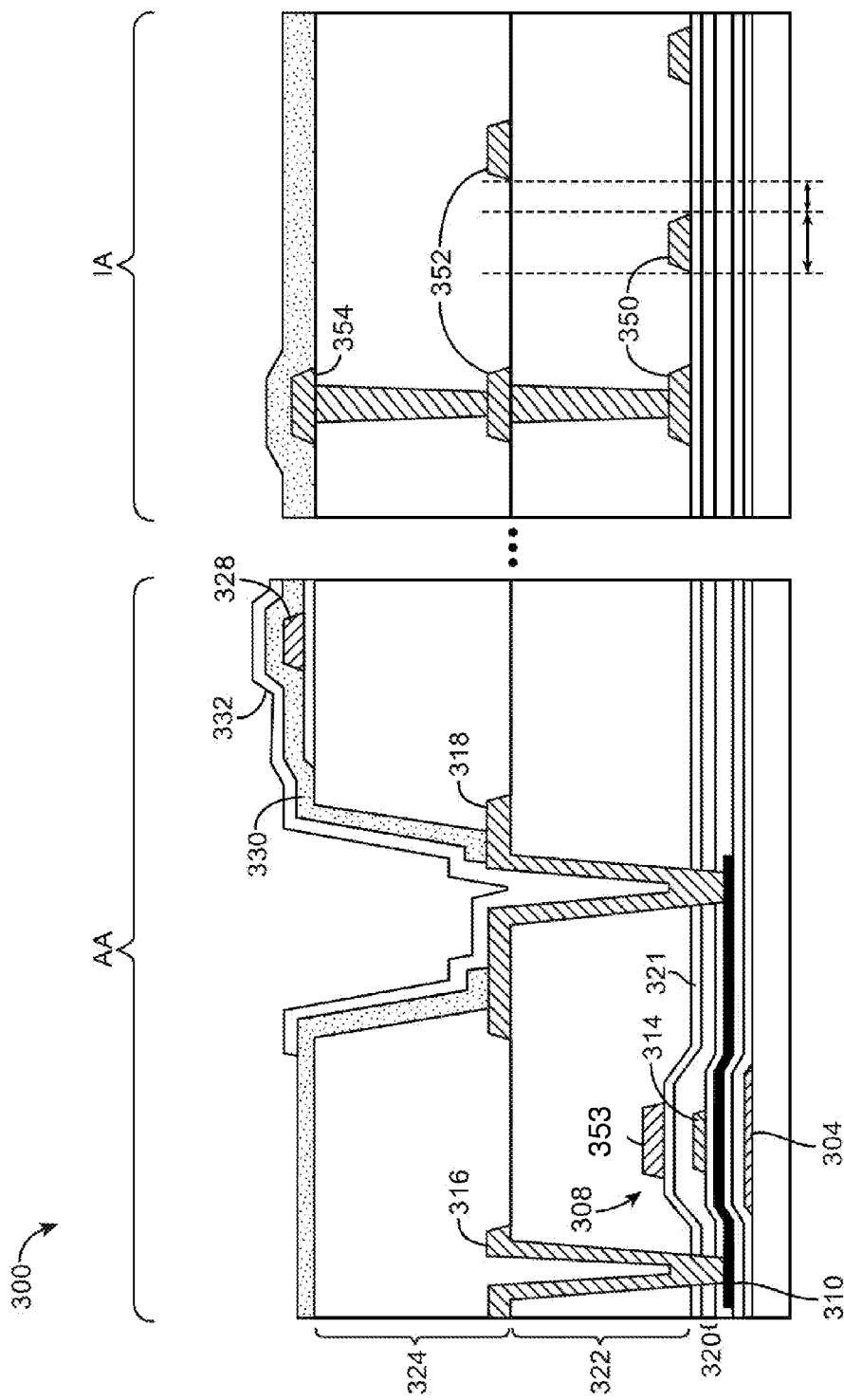
FIG. 11 is a cross-sectional side view of illustrative display pixel circuitry that includes additional gate structures formed over the M1 gate structures in accordance with an embodiment of the present invention.

In another suitable arrangement, an additional TFT gate structure may be formed in the M2s metal routing layer. FIG. 11 shows an example in which an additional gate conductor 353 is formed over the M1 gate conductor 314. In this example, the additional gate conductor 353 is formed directly on etch-stop layer 321 in the M2s metal routing layer. The use of more than one gating structure for transistor 308 in each display pixel can provide improved pixel addressing capabilities.

Figure 12:
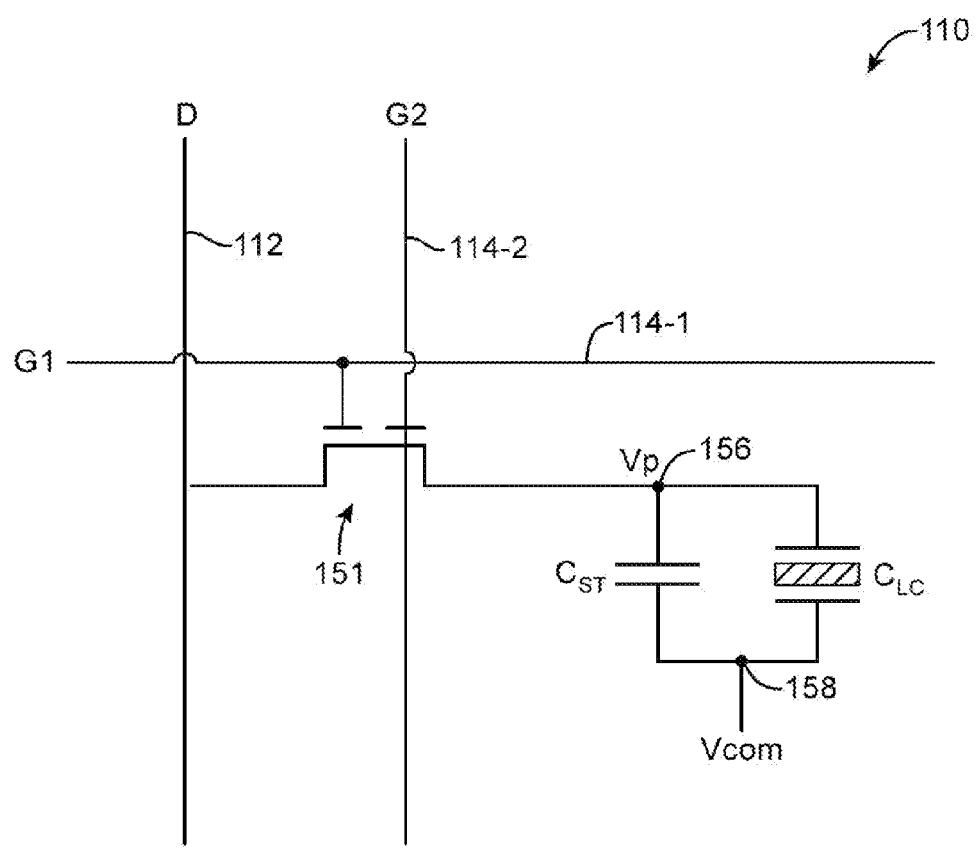
FIG. 12 is a circuit diagram of an illustrative display pixel having two gate terminals in accordance with an embodiment of the present invention.

FIG. 12 shows a circuit diagram of a display pixel 110 having a multi-gate thin-film transistor such as dual-gate transistor 151. As shown in FIG. 12, transistor 151 may have a first source-drain terminal that is coupled to a corresponding data line 112, a second source-drain terminal that is coupled to node 156 on which voltage Vp is stored, a first gate terminal that is coupled to a first gate line 114-1, and a second gate terminal that is coupled to a second gate line 114-2. First gate line 114-1 may be formed using M1 metal in layer 320 to supply a first gate signal G1 to transistor 151, whereas second gate line 114-2 may be formed using M2s metal in layer 322 to supply a second gate signal G2 to transistor 151. In the example of FIG. 12, gate line 114-1 may be routed horizontally, whereas gate line 114-2 may be routed vertically (i.e., gate line 114-1 may be orthogonal to gate line 114-2). This is merely illustrative. As another example, gate line 114-1 may be routed vertically while gate line 114-2 is routed horizontally. As yet another example, both gate lines 114-1 and 114-2 may be routed horizontally.

Gate signals G1 and G2 may be used separately or together to control the operation of transistor 151. In one arrangement, gate signals G1 and G2 will both have to be asserted to turn on transistor 151 (e.g., signals G1 and G2 will have to be high simultaneously to enable transistor 151 to pass data signals from line 112 to storage node 156). In another arrangement, only one of the two gate signals will have be asserted to turn on transistor 151 (e.g., transistor 151 can be enabled to pass data signals from line 112 to storage node 156 by driving either G1 high or driving G2 high). The description for the remainder of display pixel 110 of FIG. 12 (e.g., storage capacitor $C_{ST}$, the liquid crystal material having capacitance $C_{LC}$, and Vcom electrode 158) is similar to that already described in connection with FIG. 7 and need not be repeated. The dual-gate display pixel arrangement of FIG. 12 is merely illustrative and does not serve to limit the scope of the present invention. If desired, display pixels having more than two gate control lines can be implemented.

Figure 13:
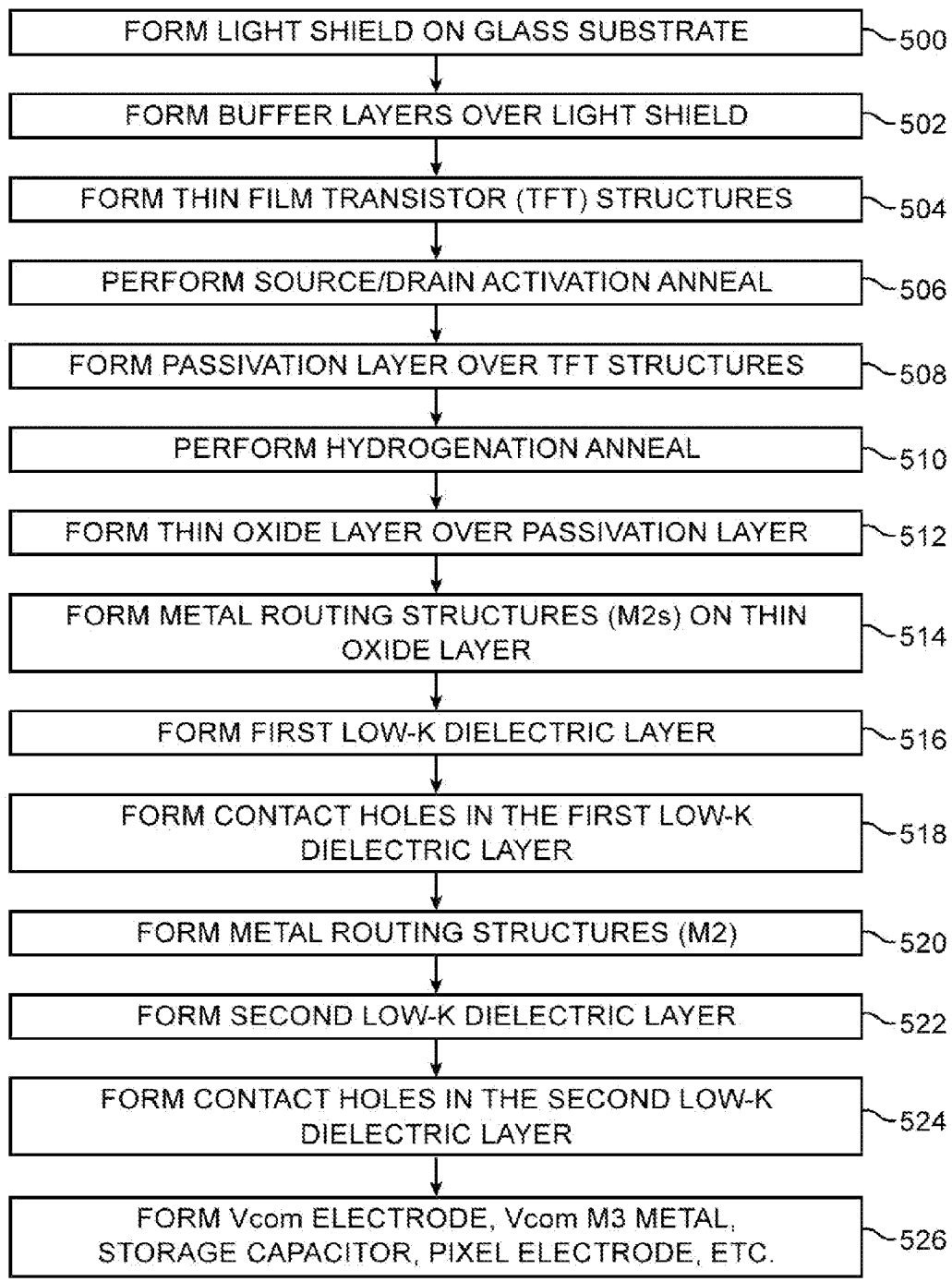
FIG. 13 is a flow chart of illustrative steps for forming the display pixel structures of the type shown in FIGS. 9 and 10 in accordance with an embodiment of the present invention.

FIG. 13 shows a flow chart of illustrative steps involved in forming TFT structures of the type described in connection with FIGS. 10 and 11. At step 500, an opaque light shield structure 304 may be formed on substrate 302. At step 502, one or more buffer layers 306 may be formed on substrate 302 over light shield 304.

At step 504, thin-film transistor structures 308 may be formed on buffer layers 306 (e.g., active area polysilicon material and associated source-drain doping and lightly-doped drain (LDD) regions, gate insulating layer, and M1 gate structures can be formed). At step 506, an annealing process may be performed to activate the source-drain regions (e.g., to help the source-drain dopants diffuse appropriately in material 310).

At step 508, a passivation layer 320 (e.g., a silicon nitride layer) may be formed over the thin-film transistor structures 308. At step 510, a hydrogenation annealing process may be performed to actually passivate the thin-film transistor 308 with layer 320.

At step 512, a thin oxide layer 321 may be formed over passivation layer 320. Layer 321 may serve as an etch-stop layer during formation of metal on layer 321.

At step 514, M2s metal routing structures may be formed on etch-stop layer 321. M2s metal routing paths may be formed in the inactive border area to provide peripheral signal routing (e.g., gate line routing, data line routing, Vcom routing, etc.) and may be formed within the active display area to provide additional gating control (see, e.g., FIGS. 11 and 12).

At step 516, a first low-k dielectric layer 322 may be formed on layer 321. At step 518, contact holes may be formed in the first low-k dielectric layer 322 via photolithography and etching processes. In some arrangements, layer 322 may be formed from light-sensitive material and may be used like photoresist that is exposed and developed to form the desired contact holes.

At step 520, M2 metal routing structures may be patterned on layer 322 in both in active and inactive areas.

At step 522, a second low-k dielectric layer 324 may be formed on the first low-k dielectric layer 322 over the M2 metal routing structures. In one arrangement, the first and second low-k dielectric layers may be formed from the same low-k dielectric material. In other arrangements, the first and second low-k dielectric layers may be formed from different low-k dielectric material having substantially similar refractive indices in an effort to maximize backlight transmittance.

At step 524, contact holes may be formed in the second low-k dielectric layer 324 via photolithography and etching processes (e.g., layer 324 may also be formed from photoresist and etch resistant materials). At step 526, the Vcom electrode 326, M3 metal routing structures 328, storage capacitor, pixel electrode 332, and other display pixel structures may be formed.

The steps of FIG. 13 are merely illustrative and do not serve to limit the scope of the present invention. In general, TFT display/touch circuitry in LCD and other types of displays may be formed in this way. Although the methods of manufacture were described in a specific order, it should be understood that other steps may be performed in between described operations, described operations may be adjusted so that they occur at slightly different times, etc.

The foregoing is merely illustrative of the principles of this invention and various modifications can be made by those skilled in the art without departing from the scope and spirit of the invention. The foregoing embodiments may be implemented individually or in any combination.

What is claimed is:

1. Display circuitry that forms an active area of a display having an array of display pixels that display images to a user and that forms an inactive area of the display that surrounds the active area, the display circuitry comprising:
   a substrate;
   a thin-film transistor formed over the substrate in the active area;
   a gate insulator layer formed over the substrate;
   a passivation layer formed on the thin-film transistor, wherein a gate electrode of the thin-film transistor is interposed between the passivation layer and the gate insulator layer;
   a first dielectric layer formed on the passivation layer;
   a second dielectric layer formed on the first dielectric layer;
   a first metal layer that forms conductive routing structures in the inactive area, wherein the first metal layer is interposed between the first dielectric layer and the second dielectric layer and wherein the conductive routing structures in the inactive area couple a display driver circuit in the inactive area to control lines in the active area that control the display pixels;
   a dielectric planarization layer formed on the second dielectric layer;
   a second metal layer that forms conductive routing structures in the inactive area interposed between the second dielectric layer and the dielectric planarization layer;
   a third metal layer that forms conductive routing structures in the inactive area formed on the dielectric planarization layer;
   a layer of insulating material in the active area and in the inactive area, wherein the third metal layer is interposed between the layer of insulating material and the dielectric planarization layer in the active area and in the inactive area; and
   a pixel electrode in the active area, wherein the layer of insulating material and the third metal layer are interposed between the pixel electrode and the substrate in the active area.

2. The display circuitry defined in claim 1, wherein the passivation layer comprises silicon nitride.

3. The display circuitry defined in claim 1, wherein the first dielectric layer comprises etch-stop material.

4. The display circuitry defined in claim 1, wherein the second dielectric layer comprises low-k dielectric material.

5. The display circuitry defined in claim 1, wherein the first metal layer and the second metal layer exhibit substantially similar resistivity.

6. The display circuitry defined in claim 1, wherein the gate electrode is formed from conductive material exhibiting greater sheet resistance than that of the first and second metal layers.

7. The display circuitry defined in claim 6, wherein the gate electrode is formed in the passivation layer.

8. Electronic device display structures that form an active area and an inactive area in a display, comprising:
   a substrate;
   a layer of liquid crystal material;
   a pixel electrode that applies an electric field to the layer of liquid crystal material;
   a thin-film transistor formed over the substrate in the active area, wherein the thin-film transistor is coupled to the pixel electrode and controls the electric field, and wherein the thin-film transistor comprises:
      source-drain structures formed over the substrate;
      a first gate structure formed over the source-drain structures; and
      a second gate structure formed over the first gate structure;
   a passivation layer formed on the first gate structure;
   a first dielectric layer formed on the passivation layer, wherein the passivation layer and the first dielectric layer are interposed between the first and second gate structures; and a first metal layer, wherein the first metal layer forms conductive routing structures in the inactive area, wherein the first metal layer forms the second gate structure, wherein the first metal layer is formed on the first dielectric layer, and wherein the conductive routing structures couple a display driver circuit in the inactive area to control lines in the active area.

9. The electronic device display structures defined in claim 8, wherein the first gate structure is formed from a first material and wherein the second gate structure is formed from a second material that is different than the first material.

10. The electronic device display structures defined in claim 9, wherein the first material exhibits a sheet resistance that is greater than that of the second material.

11. The electronic device display structures defined in claim 8, further comprising:
a first gate line that is coupled to the first gate structure; and
a second gate line that is coupled to the second gate structure, wherein the first gate line is orthogonal to the second gate line.

12. A display with an active area and an inactive area, comprising:
a substrate;
a thin-film transistor on the substrate in the active area, wherein the thin-film transistor includes a layer of active semiconductor material and a gate electrode formed from a first metal layer;
a data line formed from a second metal layer that is electrically coupled to the layer of active semiconductor material at a source-drain terminal of the thin-film transistor;
a layer of dielectric material interposed between the first metal layer and the second metal layer;
a third metal layer that is formed on the layer of dielectric material and interposed between the first metal layer and the second metal layer, wherein the third metal layer forms a conductive routing structure in the inactive area that couples the data line to a display driver; and
a layer of transparent conductive material that overlaps and is shorted to the second metal layer, wherein the layer of transparent conductive material forms a pixel electrode in the active area.

13. The display defined in claim 12, further comprising:
a gate insulator layer interposed between the gate electrode and the layer of active semiconductor material.

14. The display defined in claim 12, further comprising:
a passivation layer interposed between the layer of dielectric material and the gate electrode.

15. The display defined in claim 12, further comprising:
an additional layer of dielectric material formed on the layer of dielectric material, wherein the third metal layer is interposed between the layer of dielectric material and the additional layer of dielectric material.

16. The display defined in claim 15, further comprising:
a planarization layer formed on the additional layer of dielectric material, wherein the second metal layer is interposed between the additional layer of dielectric material and the planarization layer.

17. The display defined in claim 16, further comprising:
a fourth metal layer formed over the planarization layer, wherein the planarization layer is interposed between the fourth metal layer and the second metal layer.

18. The display circuitry defined in claim 1, wherein the conductive routing structures formed by the first metal layer in the inactive area comprise a first plurality of adjacent routing wires separated by gaps, wherein the conductive routing structures formed by the second metal layer in the inactive area comprise a second plurality of adjacent routing wires, and wherein at least one of the routing wires in the second plurality is aligned with one of the gaps between two of the routing wires in the first plurality.

19. The display circuitry defined in claim 1, wherein the passivation layer is interposed between the gate insulator layer and the first dielectric layer, the first dielectric layer is interposed between the passivation layer and the second dielectric layer, and the second dielectric layer is interposed between the first dielectric layer and the dielectric planarization layer, the display circuitry further comprising:
a common electrode in the active area,
wherein the layer of insulating material is interposed between the pixel electrode and the common electrode, and wherein the common electrode is interposed between the dielectric planarization layer and the layer of insulating material.

20. The electronic device display structures defined in claim 8, wherein the second gate structure is formed from a metal layer, and wherein the metal layer forms conductive routing structures on the first dielectric layer in the inactive area that couple a display driver circuit in the inactive area to the thin-film transistor.

21. The display defined in claim 12, wherein the second metal layer forms conductive routing structures in the inactive area, the display further comprising:
conductive vias in the inactive area that short at least one of the conductive routing structures formed by the second metal layer to the conductive routing structure formed by the third metal layer.

* * * * *